United States Patent
Xia et al.

(10) Patent No.: US 7,328,848 B2
(45) Date of Patent: Feb. 12, 2008

(54) METHOD AND SYSTEM FOR TRANSMITTING DATA BASED ON TWO-DIMENSIONAL SYMBOL TECHNOLOGIES

(75) Inventors: Yu Xia, Beijing (CN); Qianjiang Huai, Beijing (CN); Hao Wang, Beijing (CN); David Xiao D. Yang, Beijing (CN); Zhonghan Deng, Beijing (CN)

(73) Assignee: Vimicro Corporation, Beijing (CN)

( * ) Notice: Subject to any disclaimer, the term of this patent is extended or adjusted under 35 U.S.C. 154(b) by 272 days.

(21) Appl. No.: 11/304,102

(22) Filed: Dec. 14, 2005

(65) Prior Publication Data

US 2007/0017996 A1 Jan. 25, 2007

(30) Foreign Application Priority Data

Jul. 19, 2005 (CN) ........................ 2005 1 0084397

(51) Int. Cl.
*G06K 7/10* (2006.01)
(52) U.S. Cl. ............................. 235/462.11; 235/462.41; 235/462.09; 235/462.15; 235/462.24; 379/910
(58) Field of Classification Search ........... 235/462.41, 235/462.09, 462.11, 462.15, 462.24; 379/910
See application file for complete search history.

(56) References Cited

U.S. PATENT DOCUMENTS

2002/0088865 A1* 7/2002 He et al. .................... 235/494
2002/0195495 A1* 12/2002 Melick et al. ......... 235/462.01

* cited by examiner

*Primary Examiner*—Michael G. Lee
*Assistant Examiner*—Kristy A. Haupt
(74) *Attorney, Agent, or Firm*—Joe Zheng

(57) ABSTRACT

Techniques for transmitting data between devices based on two-dimensional symbols are disclosed, where the devices are generally not equipped with the traditional networking capabilities, or at least these traditional networking capabilities are not used for the data communication. According to one aspect of the techniques, two devices communicate with each other by displaying one or more two-dimensional symbols. Data is encoded into one or more symbols that are displayed on one of the devices. Images of the symbols are taken by another one of the devices to receive the data. These images are sequentially processed and decoded so that the data is now received. To accommodate various environments, the system is configured to adjust parameters pertaining to the symbols to achieve an optimum transmission rate.

10 Claims, 3 Drawing Sheets

METHOD AND SYSTEM FOR TRANSMITTING DATA BASED ON TWO-DIMENSIONAL SYMBOL TECHNOLOGIES

BACKGROUND OF THE INVENTION

1. Field of the Invention

The present invention relates to data transmission, and more particularly to method and system for transmitting data between two devices based on two-dimension barcode technology, where either one of the two devices is not equipped with the traditional networking capabilities.

2. Description of Related Art

With the development of data network and consumer electronics, there is a great need for data sharing between the network and various consumer electronics devices, such as mobile telephones, PDAs and MP3 players and etc. In some application, data such as text, image, audio and video etc. are exchanged between various devices. There are a lot of methods for data transmission between different devices, wired or wireless means. For example, cables, wireless network, infrared transmission and blue teeth technology are commonly used. Cables and cable networks need physical medium for connections, creating some inconvenience in some applications. Wireless network, infrared transmission and the blue teeth technology are wireless transmission methods, requiring no physical medium for connections but corresponding communication adapters are required to be embedded in devices, thus increasing not only the cost, but also the complexity of the devices.

Two-dimension barcode technologies have been developed in recent years, which has been applied in fields such logistics, ID identification and high rate data logging in etc. Two-dimension barcode technologies encode data into a two dimension symbol that takes a small amount of space in physical size and has higher error correction capabilities. A certain level of damage to a two-dimension symbol is not going to lose data. Two-dimension symbols can be put into applications via printing and network transmission. Comparing with the commonly-seen one-dimension barcode, a two-dimension symbol or barcode has features such as high data storage capability and strong error correcting capability. For example, QR two-dimension barcode has an ability to store as much as 2K data and recover the data when 30% of the two-dimension symbol is destroyed.

Thus there is a need for techniques for transmitting data between devices based on two-dimension barcode technology, where either one of the devices is not equipped with the traditional networking capabilities.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to techniques for transmitting data between devices based on two-dimension barcode technologies, where the devices are generally not equipped with the traditional networking capabilities, or at least these traditional networking capabilities are not used for the data communication. According to one aspect of the techniques, a first device receives data to be transmitted to a second device. The first device is configured to encode the data into one or more two-dimensional symbols that are then sequentially displayed on a display module thereof. The second device includes a camera module that is configured to take images of the displayed two-dimensional symbols. These images are sequentially processed and decoded so that the data originally from the first device is now received by the second device. If necessary, the second device can be configured to send a response to the first device by encoding the response into one or more two-dimensional symbols that are then displayed on a display module of the second device. A camera module of the first device takes pictures of the displayed symbols from the second device and processes the captured images to decode the data embedded in the symbols. As a result, the first and the second devices exchange data without using any of the traditional communication means (e.g., wired or wireless). With the present invention, many portable devices, such as digital cameras can now communicate directly.

According to another aspect of the present invention, the present invention may operate in duplex or half-duplex working mode. For the half-duplex mode, one direction is for data communication, the other direction is for control data. For the full duplex mode, the transmitted data include not only the communication data, but also the control data.

According to yet another aspect of the present invention, a data communication system involving devices for exchanging data is configured to adaptively change data density in the symbols to achieve an optimum data transmission rate. As many two-dimensional symbols are structured in terms of parameters such as versions and correction levels, these parameters are self-adjusted so that a largest amount of data can be conveyed without incurring any errors.

The present invention may be implemented in software, hardware or a combination of both as an apparatus, a system, or a process. According to one embodiment, the present invention is a data transmission system based on two-dimension symbols, the system comprises a transmitting device providing source data for transmission and dividing the source data into a plurality of data blocks, wherein the transmitting device includes: a two-dimension encoder encoding data blocks into one or more two-dimensional symbols, a display module displaying the two dimension symbols; and a receiving device receiving the source data from the transmitting device, wherein the receiving device includes: a camera module continuously capturing images of the two-dimensional symbols from the display module of the transmitting device, a two-dimensional decoder decoding the two dimension symbols into the data blocks, wherein the receiving device groups the data blocks to recover the source data.

According to another embodiment, the present invention is method for transmitting data via two dimension barcode in a system, the system comprising a data source device and a data destination device, the method comprises: dividing source data into data blocks; encoding the data blocks into one or more two-dimensional symbols; displaying the two-dimensional symbols orderly or continuously in the data source device; capturing images of the displayed two-dimensional symbols by the data destination device; decoding the images of the two-dimensional symbols into data blocks; and grouping the data blocks to recover the source date by the data destination device.

One of the features, benefits and advantages in the present invention is to provide techniques for exchanging data among devices, where the devices do not have to be equipped with wired or wireless communication means.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Figure 1:
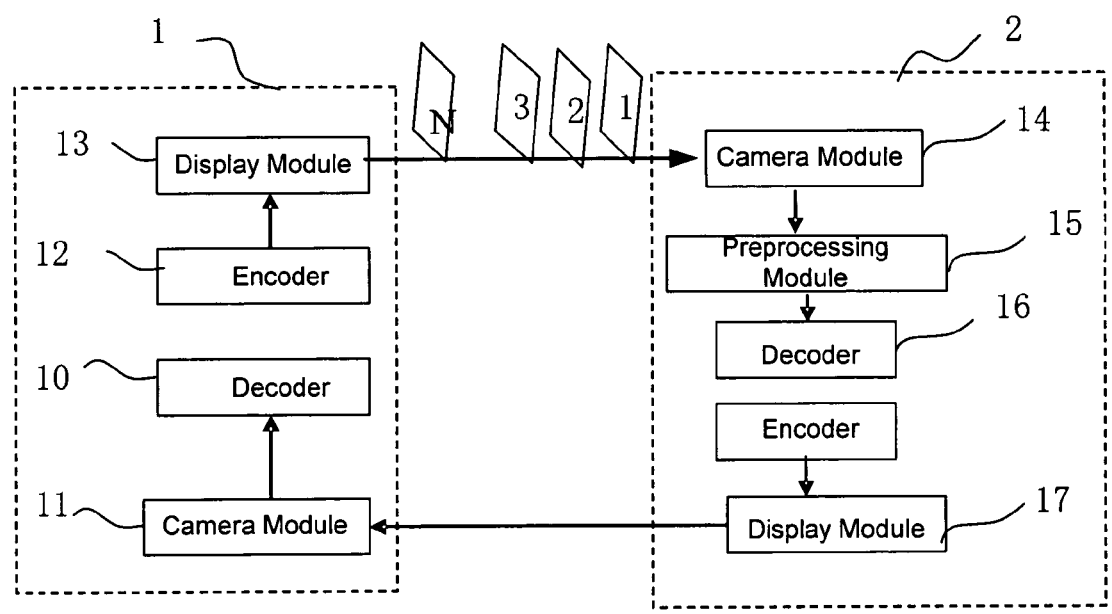
FIG. 1 is a block diagram of a data transmission system via two-dimensional barcode technologies according to one embodiment of the present invention.

FIG. 1 shows a block diagram of a data transmission system based on two-dimensional barcode technologies according to one embodiment of the present invention. The data transmission system includes a device 1 that provides source data and is referred to as a transmitting device, and a device 2 that serves as a data destination device and is referred to as a receiving device herein. Each of the devices or equipments 1 and 2 have a display module 13 or 17 and a camera module 11 or 14, a two-dimension encoder 12 or 18 and a two-dimension decoder 10 or 16. According to one embodiment, the transmitting device 1 divides source data into a plurality of data blocks, encodes data blocks into one or more two-dimension barcode symbols and then continuously displays the two-dimension barcode symbols on the display module 13 thereof according a predefined frame rate in sequence. The receiving device 2 captures images of the two-dimension barcode symbols displayed in the display module 13, preprocess the images, and then decodes the two-dimensional barcode symbols into the data blocks. Finally, the receiving device 2 groups the data blocks to recover the data. As a result, the data transmission system realizes data transmission between two devices, where neither of the two devices has to be equipped with a communication means (e.g., a wired or wireless adaptor).

The data transmission system as described above may operate in duplex or half-duplex working mode. For the half-duplex mode, one direction is for the data communication, the other direction is for control data. For the full duplex mode, the transmitted data include not only the communication data, but also the control data.

One of the features in the present invention is that the data transmission system contemplated in the present invention based on two-dimension symbols is simple and of low cost. Devices in the data transmission system do not have to be equipped with any of the traditional communication means. It is noted, however, that the transmission process strongly relies on hardware features of the camera module 14 and the display module 13. Additionally, external lighting affecting the performance of the display module as well as the camera module may interfere the data transmission. Accordingly, a mechanism is provided to adaptively gain a higher data transmission rate. According to one embodiment of the present invention, parameters such as versions, error correction levels of a two-dimension symbol and transmission parameters (e.g., frame rate) are adaptively adjusted to accommodate the environment to achieve an optimal data transmission rate.

Many two-dimension barcode symbols have a plurality of versions. For example, the QR code has 1~40 versions, which can be embedded with different capacity data. When adopting version 1, the QR symbol have the ability to store 26 bytes characters. When adopting version 40, the QR symbol have the ability to store 3706 bytes characters. Along with the growth of the version number, the storage complexity increases, accordingly, the requirement to the display module 13 and the camera module 14 increases and at the same time any external light interference should be reduced.

Many two-dimension code technologies introduce error correction functions, which can correct errors within the limited range, e.g. QR code and PDF417 code, etc. The QR code offers four error correction levels such as L, M, Q, and H. Typically, the higher the error correction level is, the more there are error correction codeword in a two-dimensional symbol, consequently, the stronger the error correction capability a two-dimensional symbol has. The error correcting level can be applicable to any version. For the QR code in the version 1, when the error correcting level is L, 7 bytes are required to serve as the error correcting codeword, the effective data is 19 bytes; when the selected error correcting level is H, 17 bytes are required to serve as the error correcting codeword, the effective data is 9 bytes.

It is observed that, for the QR code of the same version, when the error correcting level increases, the effective embed data quantity gradually decreases, but the error correcting capability increases. For the QR code with an error correcting level of L, it can correct about 7% of the error code, for the QR code with an error correcting level of H, it can correct about 30% of the error code.

It is understood that the higher the frame rate of the image sequence is during video transmission, the larger the data amount can be transmitted, which indicates a high coordination capability between a camera module and a display module, so that a receiving device is capable of analyzing the data in each frame of a two-dimensional symbol.

To facilitate the description of the present invention, the following description is based on the QR two-dimensional symbols. Those killed in the art can appreciate that the description herein may be equally applicable to other symbols. It is supposed that the QR code of Version 40 is used, the error correcting level is L, the frame rate is 10 frames per second, the data transmission rate shall be 28 KByte/s. To accommodate an environment that is unknown, according to one embodiment, a device sending out data is configured to use a relatively smaller version with relatively higher error correction level.

In order to ensure the accuracy of the data transmission under the condition of the hardware restriction and the external environmental interference, the data transmission system is configured to adjust the parameters of the two-dimension symbols being used. Depending on an exact implementation, the error correction level is fixed and the vision is adjustable, the error correction level is adjustable and the vision is fixed, or the error correction level and the vision are both adjustable. One of the objectives for adjusting the parameters regarding the two-dimensional symbols is to achieve an optimal data transmission rate.

Taking the QR code as the example, some of the parameters pertaining to the two-dimensional symbols are initialized. It is supposed that the version of the number i frame QR symbol is $M_i$, wherein $1 \leq M_i \leq 40$; the error correction level the number i frame QR barcode symbol is $C_i$, wherein $C_i$ is one of L, M, Q, or H. The transmitted data quantity is $Q_i$, the error data quantity is $E_i$, so the error code ratio of the current frame data is $$K_i = \frac{E_i}{Q_i}.$$

When no error code exists, $K_i=0$. The effective data capacity of the current QR code image is $P_i$, that then the permitted maximum code error ratio is $$\overline{K}_i = \frac{Q_i - P_i}{Q_i}。$$

According to one embodiment, a high threshold $T_h$ is established to determine whether or not to decrease the version of the QR, $0 \leq T_h \leq \overline{K}_i$. Additionally, a low threshold $T_l$ is established to determine whether or not to increase the version of the QR, and it is known that $0 \leq T_l \leq T_h$. In one special embodiment, $T_h$ is equal to zero, when the error ratio of continuous N frames is zero, it means that the condition for data transmission is enough, and the version of the QR is increased.

Figure 2:
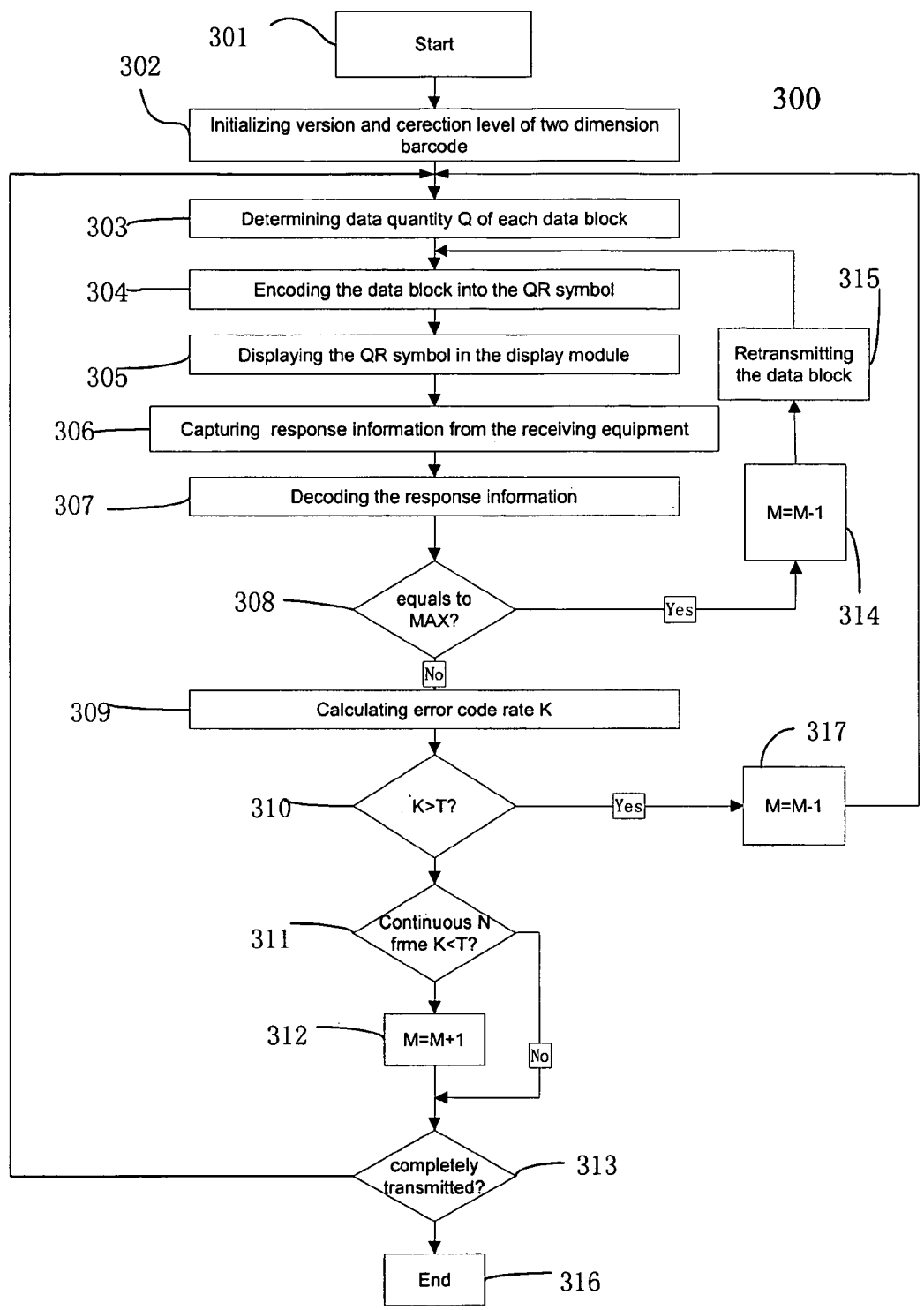
FIG. 2 is a flowchart or process of a transmitting equipment for transmitting data via two-dimensional symbols according to one embodiment of the present invention.
Figure 3:
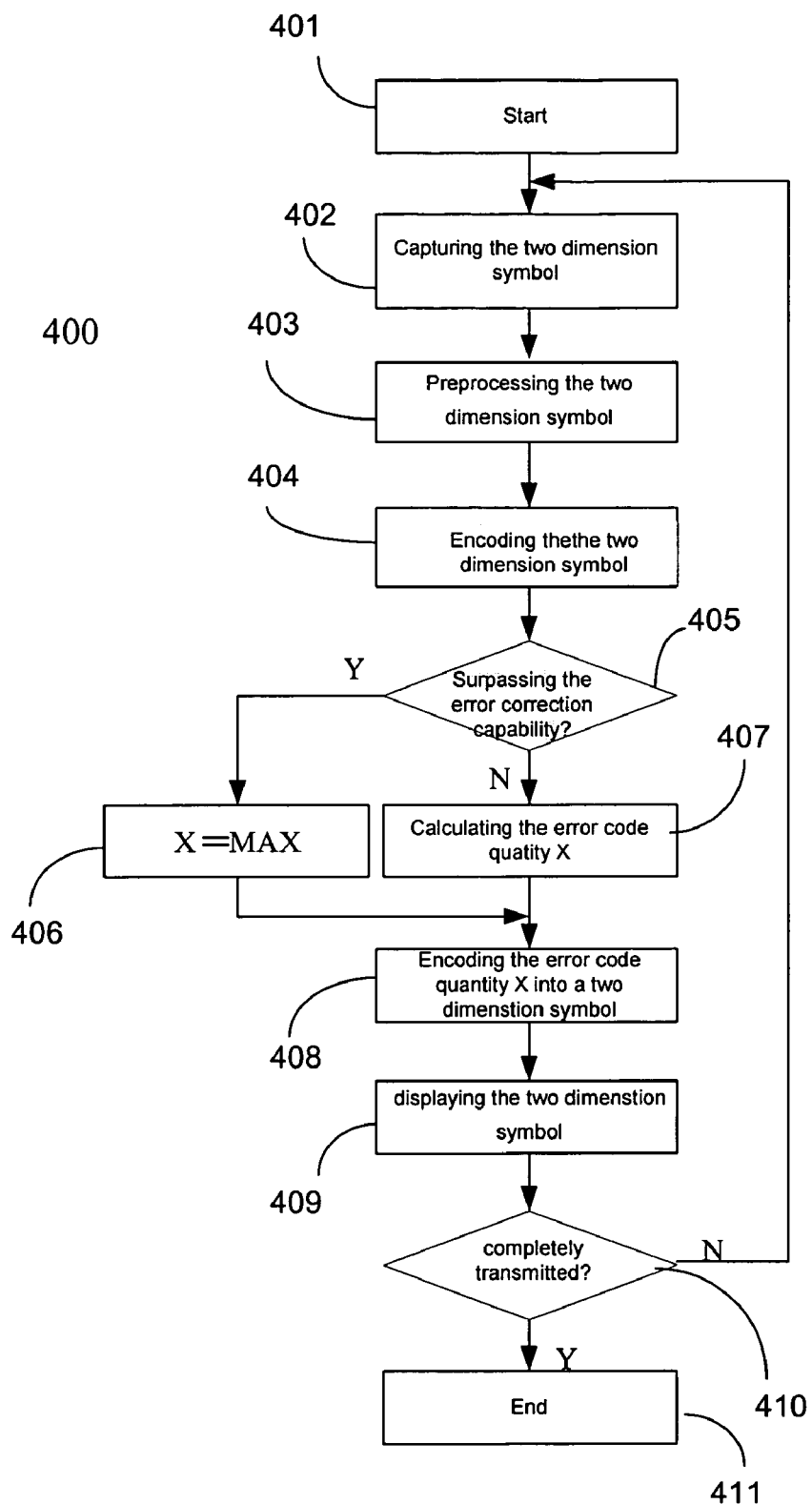
FIG. 3 is a flowchart or process of a receiving equipment for transmitting data via two-dimensional symbols according to one embodiment of the present invention.

FIG. 2 and FIG. 3 show, respectively, a flowchart or process of a transmitting or receiving device for transmitting data via two-dimensional symbols according to one embodiment of the present invention. The process 300 or 400 may be implemented in software, hardware or a combination of both as an apparatus, a system, or a process. The process 300 or 400 shall be readily understood in conjunction with FIG. 2 and FIG. 3.

In FIG. 2, the process 300 begins at 302, where a transmitting device initializes some of the parameters for a symbols being used. Some of the parameters include a symbol version and an error correcting level. Subsequently, the transmitting device determines data amount Q of each data block in accordance with the current QR code version and the error correcting level at 303. It encodes the data block into the QR symbol at 304, and displays the two-dimensional symbol on a display module of the transmitting device at 305 to complete the data block transmission. A receiving device receives an image of the two dimension symbol (e.g., via a camera thereof), processes it and finally responds with a type of response information.

At 306, the camera module 11 of the transmitting device 1 takes the response information from the receiving device 15, and this information also is encoded in a QR code. Because the response information has fewer data amount, a relatively lower version with relatively higher error correction level is preferred.

According to one embodiment, the response information comprises error code information occurred during this transmission, namely the error data quantity of this transmission, by which the transmitting device can determine if to retransmit the data block or to adjust the version of the QR code in next data transmission. At 307, it decodes the response information and gains the error data quantity in this transmission. When the receiving end can not decode after receiving the data, namely the data transmission has exceeded the error correcting capability, under this condition, the error code information shall be set as MAX.

At 308, the transmitted device determines if the error data quantity is equal to MAX. The YES branch is taken to 314, where the version M is increased by one, and the process 300 goes to 315, where the data block is recoded according to the corrected version, and then the process 300 switches to 304 to transmit again. If NO, it means the data has been successfully received in the receiving device and the process 300 goes to 309, where the error code ratio K is calculated according to K=X/Q.

At 310, the process 300 determines if $K>T_h$, the YES branch is taken to 317, where decreasing the version by one because that means it has successfully received the data, but the error ratio is relatively high. The process 300 goes to 303 to continue the data transmission. The NO branch is taken to 311, where determining if the consecutive N frame transmitted symbols can ensure $K<T_l$, which demonstrates that no error data exists. If YES, the version M is increased by one to accelerate the transmission rate at 312. Otherwise the process 300 continues to adopt the current version. At 313, determining if all data blocks have been transmitted, the YES branch is taken to 316, where the process exits. The NO branch is taken to 303 to continue the transmission.

Referring to FIG. 3, when the display module of the transmitting device displays the coded symbol, the camera 14 of the receiving device at 402 captures the symbol in image. At 403, a preprocessing module 15 of the receiving device is configured to preprocess the captured image to improve the quality thereof. It decodes the QR symbol at 404 and the process 400 then goes to 405, where it determines if it surpasses the error correction capability. The YES branch is taken to 406, where the error code quantity is set to equal to MAX, and then the process 400 goes to 408, otherwise calculating the error code quantity X at 407. It continues the QR code for the error code quantity X at 408.

At 409, the display module of the receiving device displays a QR symbol as the response information. Then at 410, it judges if the data has been completely received, if so, the process 400 exits the process, if not, the camera continues the data capture and the process 400 repeats the above-mentioned process.

In the present embodiment, the error code amount in transmission serves as the response information. In a modification, the error code ratio is adapted to serves as the response information. In other words, the response information may be any information as long as it can directly or indirectly reflect the error code information.

Additionally, each data block is encoded into a QR symbol, the display module 13 or 17 is able to display one or more QR symbol at one time.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. For example, the present invention may be practiced independently from an online transaction module and can be used to capture displayed pages for collecting evidences or updating a digital evidence system. Accordingly, the scope of the present invention is defined by the appended claims rather than the foregoing description of embodiments.

What is claimed is:

1. A data transmission system based on two-dimension symbols, the system comprising:
    a transmitting device providing source data for transmission and dividing the source data into a plurality of data blocks, the transmitting device includes:
        a two-dimension encoder encoding data blocks into one or more two-dimensional symbols;
        a display module displaying the two dimension symbols; and
    a receiving device receiving the source data from the transmitting device, wherein the receiving device comprises:
        a camera module continuously capturing entire images of the two-dimensional symbols from the display module of the transmitting device;
        a two-dimensional decoder decoding the two dimension symbols into the data blocks, wherein the receiving device groups the data blocks to recover the source data, and
    wherein the transmission system configures parameters pertaining to the two-dimensional symbols for transmission between the transmitting device and the receiving device according to the error code information received from the receiving device.

2. The data transmission system as claimed in claim 1, wherein the receiving device further comprises:
    a two-dimensional encoder encoding error code information into a two-dimensional symbol;
    a display module displaying the two-dimensional symbol, wherein the transmitting device further comprises:
    a camera module continuously capturing an entire image of the two-dimensional symbol from the display module of the receiving device; and
    a two-dimensional decoder decoding the two-dimensional symbol.

3. The data transmission system as claimed in claim 1, wherein either one of the receiving device and the transmitting device further comprises a preprocessing module configured to preprocess the captured image(s).

4. The data transmission system as claimed in claim 1, wherein the data transmission system operates in a duplex or a half-duplex working mode.

5. The data transmission system as claimed in claim 1, wherein at least one of the transmitting device and the receiving device is a handhold device without traditional communication means.

6. A method for transmitting data via two dimension barcode in a system, the system comprising a data source device and a data destination device, the method comprising:
    dividing source data into data blocks;
    encoding the data blocks into one or more two-dimensional symbols;
    displaying the two-dimensional symbols sequentially in the data source device;
    capturing entire images of the displayed two-dimensional symbols by the data destination device;
    decoding the images of the two-dimensional symbols into data blocks;
    grouping the data blocks to recover the source date by the data destination device;
    initializing parameters pertaining to the two-dimensional symbols to accommodate an environment, and
    wherein, after the decoding of the images of the two-dimensional symbols, the data destination device responds with error code information to the data source device via a two-dimensional symbol from which the data source device determines if to reconfigure the parameters of the two-dimensional symbols according to error code information included in the two-dimensional symbol.

7. The method as claimed in claim 6, wherein the parameters includes a version and an error correction level pertaining to the two-dimensional symbols.

8. The method as claimed in claim 7, wherein, if the error code information surpasses or equals to a predefined error correction capability of the two dimension symbols, the data source device increases the error correction level or decreases the vision, and then retransmits what was sent before.

9. The method as claimed in claim 7, wherein, if the error code information is more than a predefined threshold, the data source device increases the error correction level or decreases the vision.

10. The method as claimed in claim 7, wherein, if the error code information is less than a predefined low threshold, the data source device decreases the error correction level or increases the vision to achieve an optimal data transmission rate.

* * * * *